(12) United States Patent
Zhang et al.

(10) Patent No.: US 12,419,050 B2
(45) Date of Patent: Sep. 16, 2025

(54) SEMICONDUCTOR DEVICE AND ITS MANUFACTURING METHOD, MEMORY AND MEMORY SYSTEM

(71) Applicant: Yangtze Memory Technologies Co., Ltd., Hubei (CN)

(72) Inventors: Kun Zhang, Hubei (CN); Wenxi Zhou, Hubei (CN); Linchun Wu, Hubei (CN); Zhiliang Xia, Hubei (CN); Zongliang Huo, Hubei (CN)

(73) Assignee: Yangtze Memory Technologies Co., Ltd., Wuhan (CN)

( * ) Notice: Subject to any disclaimer, the term of this patent is extended or adjusted under 35 U.S.C. 154(b) by 449 days.

(21) Appl. No.: 18/090,592

(22) Filed: Dec. 29, 2022

(65) Prior Publication Data

US 2024/0164096 A1    May 16, 2024

(30) Foreign Application Priority Data

Nov. 11, 2022   (CN) .......................... 202211415775.6

(51) Int. Cl.
| | |
|---|---|
| *H10B 43/27* | (2023.01) |
| *H01L 23/528* | (2006.01) |
| *H10B 41/10* | (2023.01) |
| *H10B 41/27* | (2023.01) |
| *H10B 41/35* | (2023.01) |
| *H10B 43/10* | (2023.01) |
| *H10B 43/35* | (2023.01) |

(52) U.S. Cl.
CPC ......... *H10B 43/27* (2023.02); *H01L 23/5283* (2013.01); *H10B 41/10* (2023.02); *H10B 41/27* (2023.02); *H10B 41/35* (2023.02); *H10B 43/10* (2023.02); *H10B 43/35* (2023.02)

(58) Field of Classification Search
CPC ........ H10B 41/10; H10B 41/27; H10B 41/35; H10B 43/10; H10B 43/27; H10B 43/35; H10B 43/50; H01L 23/5283
See application file for complete search history.

(56) References Cited

U.S. PATENT DOCUMENTS

2016/0365351 A1* 12/2016 Nishikawa ............... H10D 1/47
2019/0296038 A1*  9/2019 Noda ..................... H10B 43/50

* cited by examiner

*Primary Examiner* — Brook Kebede
(74) *Attorney, Agent, or Firm* — Oblon, McClelland, Maier &Neustadt, L.L.P.

(57) ABSTRACT

Aspects of the disclosure provide a semiconductor device including a stack structure and a first conductive pillar. The stack structure can include a plurality of interlayer insulating layers and gate layers arranged alternately along a stack direction, and stack structure an array region and a staircase region adjoining the array region. The stack structure has a plurality of staircases in the staircase region arranged corresponding to the gate layers. Each of the gate layers can include a first gate part at the corresponding staircase and a second gate part connected to the first gate part, and a thickness of the first gate part along the stack direction is less than that of the second gate part along the stack direction. The first conductive pillar is arranged in the staircase region and penetrates through the stack structure along the stack direction, and the first conductive pillar is electrically connected with the first gate part.

19 Claims, 13 Drawing Sheets forming a stack layer which includes a plurality of interlayer insulating layers and a plurality of gate layers formed alternately along a stack direction, wherein the stack layer includes an array region and a staircase region adjoining the array region, a plurality of staircases corresponding to the gate layers are formed in the staircase region of the stack layer, each of the gate layers includes a first gate part at the corresponding staircase and a second gate part connected to the first gate part, and a thickness of the first gate part along the stack direction is less than that of the second gate part along the stack direction ~S10 forming, in the staircase region, a first conductive pillar penetrating through the stack layer along the stack direction, the first conductive pillar being electrically connected with the first gate part ~S20

Fig. 10

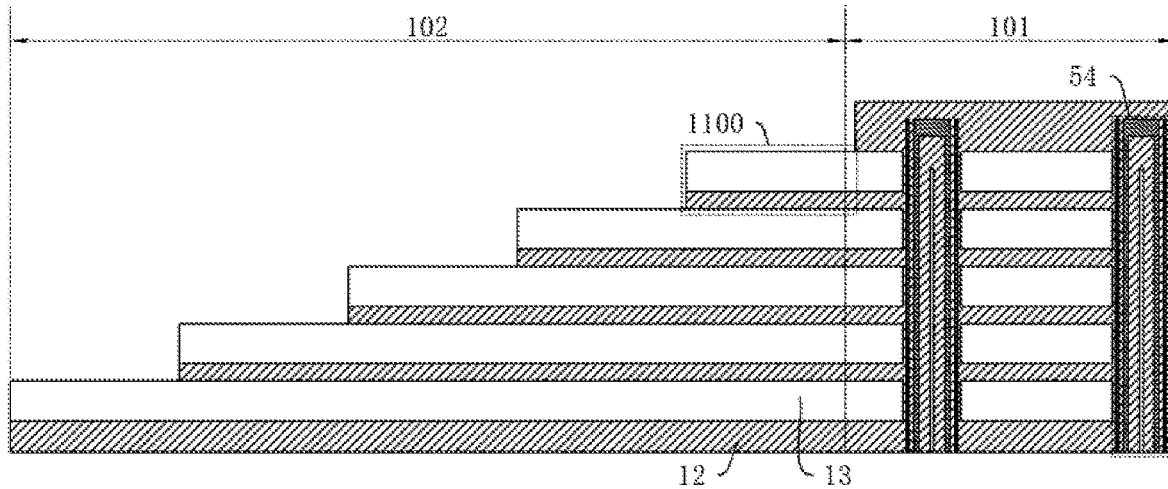

Fig. 11

SEMICONDUCTOR DEVICE AND ITS MANUFACTURING METHOD, MEMORY AND MEMORY SYSTEM

INCORPORATION BY REFERENCE

This present application claims the benefit of Chinese Patent Application No. 202211415775.6 filed on Nov. 11, 2022 which is incorporated herein by reference in its entirety.

BACKGROUND

Technical Field

The present disclosure relates to the field of semiconductor technology, and in particular to a semiconductor device and its manufacturing method, a memory and a memory system.

Description of the Related Art

With the development of planar flash memory, the production process of semiconductor has made great progress. But in recent years, the development of planar flash memory has encountered various challenges: physical limit, existing development technology limit and storage electron density limit. In order to solve the difficulties encountered by the planar flash memory and find a lower production cost per unit memory cell, three-dimensional (3D) flash memory structure came into being. In the structure of 3D NAND flash memory device, multi-layer gate layers and insulating layers that are stacked vertically and staggered are included, with channel holes being formed in the stack structure (or referred to as "stack"), memory cell strings being formed in the channel holes, the gate layers in the stack structure being used as the gate lines of the memory cells in each layer, so as to realize the stacked 3D NAND flash memory device.

At present, in the stack structure, it is necessary to etch a contact hole corresponding to each staircase and form a conductive pillar in the contact hole to achieve the purpose of inputting electrical signals to the gate layer at each staircase. However, in the process of etching the contact hole, it is easy to have bad phenomena such as etching through, which makes the conductive pillar short circuited between different gate layers and produces a crosstalk phenomenon.

SUMMARY

Implementations of the present disclosure provides a semiconductor device and its manufacturing method, a memory and a memory system, which can avoid the occurrence of the phenomenon of short circuit between different gate layers caused by the etching accuracy of the first contact hole, and improve the yield of the semiconductor device.

The implementation of the present disclosure provides a semiconductor device that can include a stack structure including a plurality of interlayer insulating layers and gate layers arranged alternately along a stack direction, wherein the stack structure includes an array region and a staircase region adjoining the array region. Further, the stack structure can have a plurality of staircases in the staircase region arranged corresponding to the gate layers, each of the gate layers includes a first gate part at the corresponding staircase and a second gate part connected to the first gate part, and a thickness of the first gate part along the stack direction is less than that of the second gate part along the stack direction. The semiconductor device that can also include a first conductive pillar arranged in the staircase region and penetrating through the stack structure along the stack direction, and the first conductive pillar is electrically connected with the first gate part.

In an implementation of the present disclosure, the first conductive pillar penetrates through a plurality of the gate layers along the stack direction, and the semiconductor device further includes a conducting part between the first conductive pillar and the first gate part of one of the gate layers and arranged around the first conductive pillar and an insulating part between the first conductive pillar and the second gate parts of the other gate layers and arranged around the first conductive pillar. The first gate part can be arranged around the conducting part and in contact with the conducting part, the first conductive pillar can be electrically connected with the corresponding one first gate part through the conducting part, and the second gate part can be arranged around the insulating part.

In an implementation of the present disclosure, a width of the conducting part along a first direction is less than that of the insulating part along the first direction, and the first direction is perpendicular to the stack direction.

In an implementation of the present disclosure, the first gate part includes a conductive layer and a first dielectric layer at least between the conductive layer and the interlayer insulating layer, and the conductive layer is in contact with the conducting part, and a thickness of the conducting part along the stack direction is greater than that of the conductive layer along the stack direction.

In an implementation of the present disclosure, the conducting part includes a conductive sub-part and a first adhesive buffer sub-part, the first adhesive buffer sub-part is between the first gate part and the conductive sub-part, and the conductive sub-part is between the first conductive pillar and the first adhesive buffer sub-part.

In an implementation of the present disclosure, the first conductive pillar includes a conductive body and a second adhesive buffer sub-part covering the conductive body, and the second adhesive buffer sub-part is between the conductive sub-part and the conductive body.

In an implementation of the present disclosure, the semiconductor device further includes a support pillar arranged in the staircase region, and the support pillar penetrates through the stack structure along the stack direction.

In an implementation of the present disclosure, the semiconductor device includes a peripheral region on a side of the staircase region away from the array region, and a dielectric layer covering the stack structure and extending to the peripheral region. The semiconductor device can further include a second conductive pillar arranged in the peripheral region and penetrating through the dielectric layer, and a material of the second conductive pillar is the same as that of the first conductive pillar.

In an implementation of the present disclosure, the semiconductor device further includes a gate slit penetrating through the stack structure along the stack direction, and a semiconductor layer and an oxide layer filled in the gate slit, and the oxide layer covers a side wall of the semiconducting layer.

According to the above objects, the implementation of the present application provides a manufacturing method of a semiconductor device. The manufacturing method of the semiconductor device includes the step of forming a stack structure which includes a plurality of interlayer insulating layers and a plurality of gate layers formed alternately along a stack direction, wherein the stack structure includes an array region and a staircase region adjoining the array region, a plurality of staircases corresponding to the gate layers are formed in the staircase region of the stack structure, each of the gate layers includes a first gate part at the corresponding staircase and a second gate part connected to the first gate part, and a thickness of the first gate part along the stack direction is less than that of the second gate part along the stack direction. The manufacturing method of the semiconductor device includes the step forming, in the staircase region, a first conductive pillar penetrating through the stack structure along the stack direction, the first conductive pillar being electrically connected with the first gate part.

In an implementation of the present disclosure, the step of forming the stack structure further includes providing a substrate, and forming the plurality of interlayer insulating layers and gate sacrificial layers laminated along the stack direction on the substrate, wherein the plurality of interlayer insulating layers and the plurality of gate sacrificial layers form a plurality of initial staircases in the staircase region, and each of the initial staircases includes one of the gate sacrificial layers and one of the interlayer insulating layers, wherein the one of the gate sacrificial layers and the one of the interlayer insulating layers are in the staircase region and laminated. The step of forming the stack structure further includes thinning the gate sacrificial layer at each of the initial staircases, removing the gate sacrificial layer to form a plurality of slots, and forming the plurality of gate layers in the plurality of slots to obtain the stack structure.

In an implementation of the present disclosure, after the step of thinning the gate sacrificial layer at each of the initial staircases, the manufacturing method further includes forming a first contact hole in the staircase region, the first contact hole penetrating through the stack structure along the stack direction, and forming an intermediate column in the first contact hole.

In an implementation of the present disclosure, the step of forming the plurality of gate layers in the plurality of slots to obtain the stack structure further includes removing the intermediate column in the first contact hole, and making the first contact hole penetrate through the plurality of gate layers along the stack direction, etching the first gate part of one of the gate layers in the first contact hole to form a first groove, and etching the second gate part of the other gate layers in the first contact hole to form a second groove.

In an implementation of the present disclosure, the step of forming, in the staircase region, a first conductive pillar penetrating through the stack structure along the stack direction further includes forming a conductive functional material layer in the first contact hole, wherein the conductive functional material layer is filled in the first groove and covers an inner wall of the second groove, and removing at least the conductive functional material layer outside the first groove to form a conducting part in the first groove, wherein the first gate part is around the conducting part and in contact with the conducting part. The step can further include forming an insulating part in the second groove, wherein the second gate part is around the insulating part, and forming the first conductive pillar corresponding to the first contact hole, wherein the first conductive pillar is electrically connected with the first gate part through the conducting part in the first contact hole.

In an implementation of the present disclosure, the step of forming a conducting part in the first groove includes forming a conductive sub-part and a first adhesive buffer sub-part, wherein the first adhesive buffer sub-part is formed between the first gate part and the conductive sub-part, and the conductive sub-part is formed between the first conductive pillar and the first adhesive buffer sub-part.

In an implementation of the present disclosure, the step of forming a plurality of the first conductive pillars corresponding to the respective first contact holes includes forming a conductive body and a second adhesive buffer sub-part covering the conductive body, wherein the second adhesive buffer sub-part is formed between the conductive sub-part and the conductive body.

In an implementation of the present disclosure, the semiconductor device comprises a peripheral region on a side of the staircase region away from the array region and a dielectric layer formed at least in the peripheral region, the step of forming a first contact hole in the staircase region further includes using the same process to form the first contact hole, a second contact hole in the staircase region and form a third contact hole in the peripheral region, wherein the first contact hole and the second contact hole both penetrate through the stack structure along the stack direction, and the third contact hole penetrates through the dielectric layer along the stack direction.

In an implementation of the present disclosure, the step of forming an intermediate column in the first contact hole further include forming a support pillar in the second contact hole, and the step of forming the first conductive pillar corresponding to the first contact hole further includes forming a second conductive pillar in the peripheral region, wherein the second conductive pillar is formed in the third contact hole.

According to the above objects, the implementation of the present disclosure provides a memory, and the memory includes the semiconductor device.

According to the above objects, the implementation of the present disclosure provides a memory system, and the memory system includes the memory and a controller which is coupled to the memory and used to control the memory to store data.

According to the semiconductor device and its manufacturing method, a memory and a memory system provided by the implementation of the present disclosure, a plurality of first conductive pillars penetrating through the stack structure are arranged in the staircase region, and the first gate part of the gate layer at each staircase corresponds to at least one first conductive pillar and is electrically connected with the corresponding first conductive pillar. That is, the first conductive pillar in the present disclosure directly penetrates through the stack structure, and it is not necessary to accurately control the first conductive pillar to fall on each staircase. Therefore, the present disclosure can avoid the occurrence of the phenomenon of short circuit between different gate layers caused by the etching accuracy of the contact hole of the first conductive pillar, and improve the yield of semiconductor devices.

BRIEF DESCRIPTION OF THE DRAWINGS

The technical solution and other beneficial effects of the present disclosure will be apparent through a detailed description of the specific implementations of the present disclosure in combination with the accompanying drawings.

FIG. 10 is a flowchart of a manufacturing method of a semiconductor device provided by an exemplary implementation of the present disclosure;

FIGS. 11 to 20 are schematic diagrams of structures of a manufacturing method of a semiconductor device provided by an exemplary implementation of the present disclosure;

DETAILED DESCRIPTION

Figure 1:
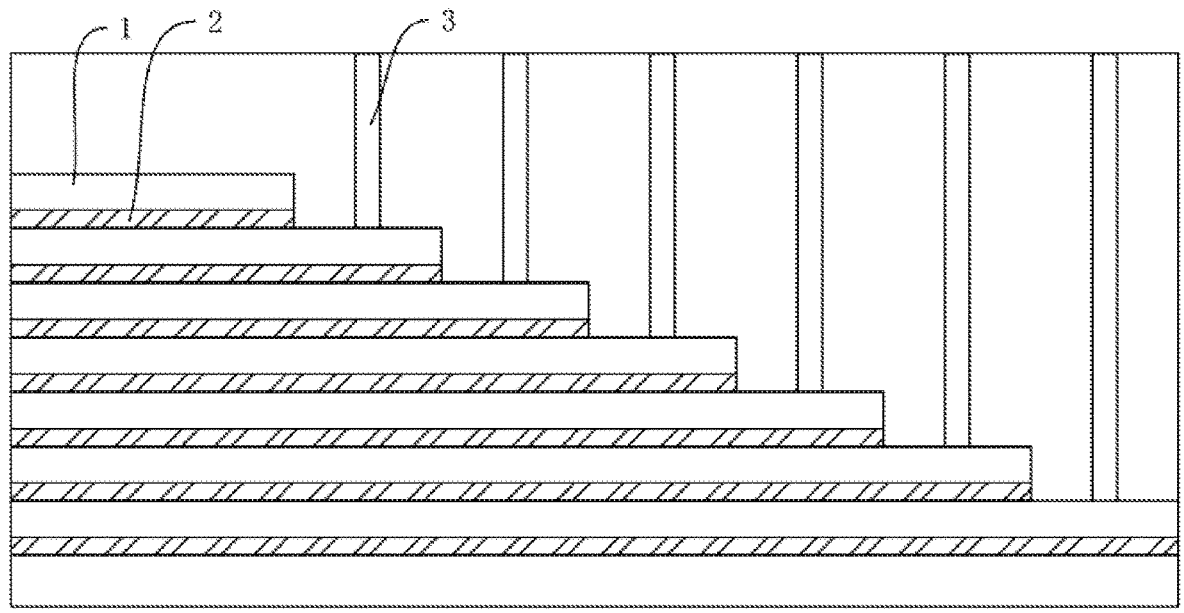
FIG. 1 is a schematic diagram of a cross-sectional structure of a semiconductor device in an exemplary implementation.

The technical solutions in the implementations of the present disclosure will be clearly and completely described below in combination with the accompanying drawings in the implementation of the present disclosure. Obviously, the described implementations are only a part of the implementations of the present disclosure, not all of them. Based on the implementations in the present disclosure, all the other implementations obtained by those skilled in the art without making inventive work fall within the protection scope of the present disclosure.

The following description provides many different implementations or examples to implement different structures of the present disclosure. In order to simplify the description of the present disclosure, the components and arrangements of specific examples are described below. Of course, they are merely examples and are not intended to limit the present disclosure. In addition, reference numerals and/or reference letters may be repeated in different examples of the present disclosure. Such repetition is for the purpose of simplification and clarity, and does not in itself indicate the relationship between various discussed implementations and/or arrangements. In addition, the present disclosure provides examples of various specific processes and materials, but those skilled in the art can be aware of the application of other processes and/or the use of other materials.

Referring to FIG. 1, in the related art, the semiconductor device includes a stack structure, and the stack structure is formed by a plurality of gate conductive layers 1 and a plurality of gate insulating layers 2 alternated and laminated, the plurality of gate conductive layers 1 and gate insulating layers 2 form a plurality of staircases, and the semiconductor device includes a plurality of word line contacts 3, so that each word line contact 3 falls on each staircase to realize the electrical connection between the word line contact 3 and the gate conductive layer 1 at the corresponding staircase. In the manufacturing process of semiconductor devices, it is usually necessary to pre-etch a contact hole, and then deposit a word line contact 3 in the contact hole. However, with the increase of the number of stack structures of the stack structure, the etching depth of the contact hole is increasing, and the requirements for the etching process are also increasing. Due to process fluctuations and errors, the phenomenon of etching through is easy to occur in the etching process, leading to that the word line contact 3 connects the gate conductive layers 1 of different layers, resulting in signal crosstalk.

Figure 2:
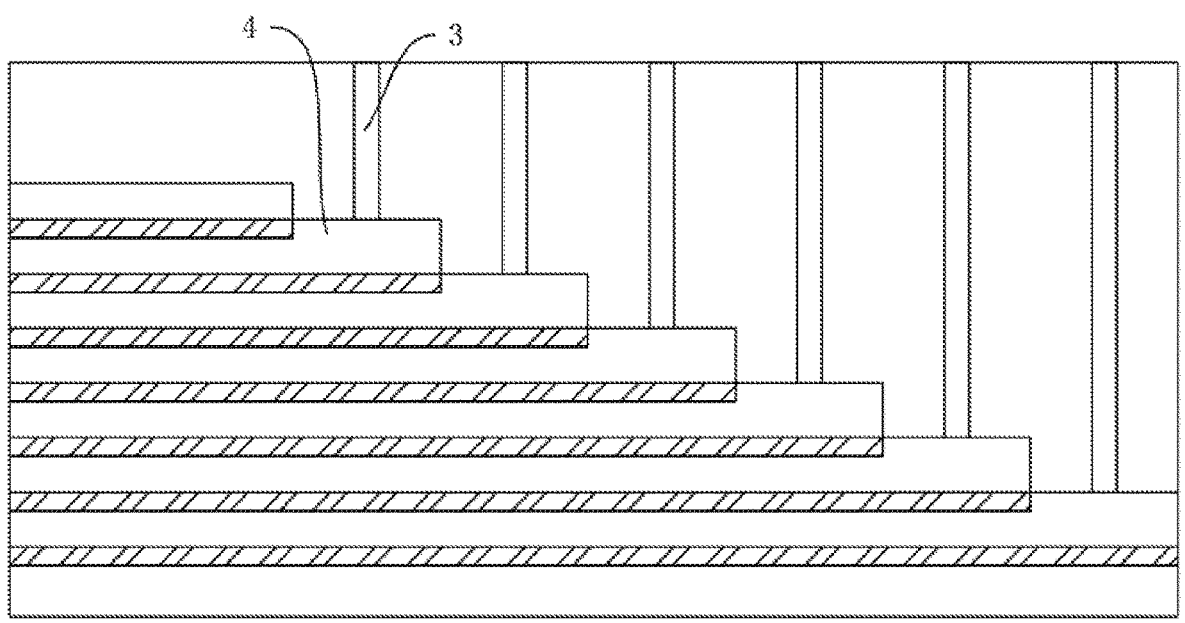
FIG. 2 is a schematic diagram of another cross-sectional structure of a semiconductor device in an exemplary implementation.

Further to improve the structure of semiconductor devices in related technologies, referring to FIG. 2, the gate conductive layer 4 at the staircase is thickened to avoid the occurrence of the phenomenon of etching through. However, in the process, the thickness of the gate sacrificial layer at the staircase will also increase so that after the subsequent removal of the gate sacrificial layer to form a slot, it is difficult for the conductive material to fill up the slot at the staircase and be removed in the subsequent etching process, resulting in that the subsequent word line contact 3 cannot be electrically connected with the gate conductive layer 4. Therefore, in the related technology, it is difficult to make the word line contact 3 be connected with the gate conductive layer 1 (4) correspondingly while ensuring the yield.

Figure 3:
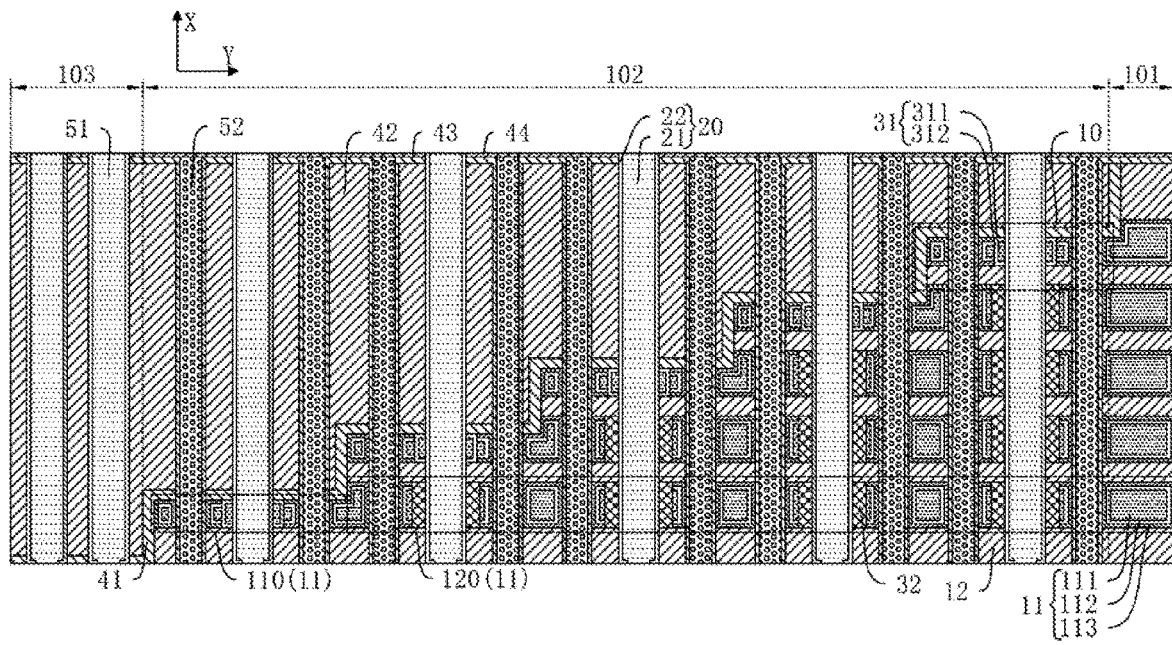
FIG. 3 is a schematic diagram of a cross-sectional structure of a part of region of a semiconductor device provided by an exemplary implementation of the present disclosure.

In order to solve the above problem, the implementation of the present disclosure provides a semiconductor device. Referring to FIG. 3, the semiconductor device includes a stack structure and a first conductive pillar 20.

The stack structure includes a plurality of interlayer insulating layers 12 and gate layers 11 alternately arranged along the stack direction X. The stack structure includes an array region 101 and a staircase region 102 adjoining the array region 101. The stack structure has, in the staircase region 102, a plurality of staircases 10 arranged corresponding to the gate layers 11. Each gate layer 11 includes a first gate part 110 at a corresponding staircase 10 and a second gate part 120 connected to the first gate part 110, and the thickness of the first gate part 110 along the stack direction X is less than that of the second gate part 120 along the stack direction X. A first conductive pillar 20 is arranged in the staircase region 102 and penetrates through the stack structure along the stack direction X, and the first conductive pillar 20 is electrically connected with the first gate part 110. That is, the implementation of the present disclosure realizes the electrical connection between the first conductive pillar 20 and the corresponding gate layer 11 by arranging the first conductive pillar 20 as penetrating through the stack structure and electrically connecting with the first gate part 110 at the staircase 10, and thus does not need to accurately control the first conductive pillar 20 to fall on each staircase 10. That is, the implementation of the present disclosure can avoid the occurrence of the phenomenon of short circuit between different gate layers 11 caused by the etching accuracy of the contact hole of the first conductive pillar 20, and improve the yield of semiconductor devices.

Figure 4:
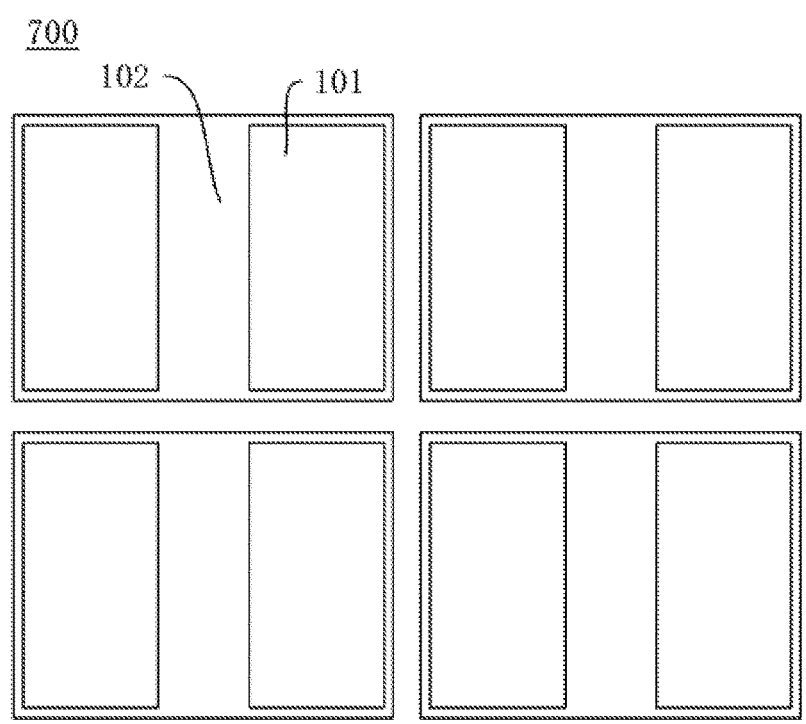
FIG. 4 is a schematic diagram of a top view structure of a semiconductor device provided by an exemplary implementation of the present disclosure.
Figure 5:
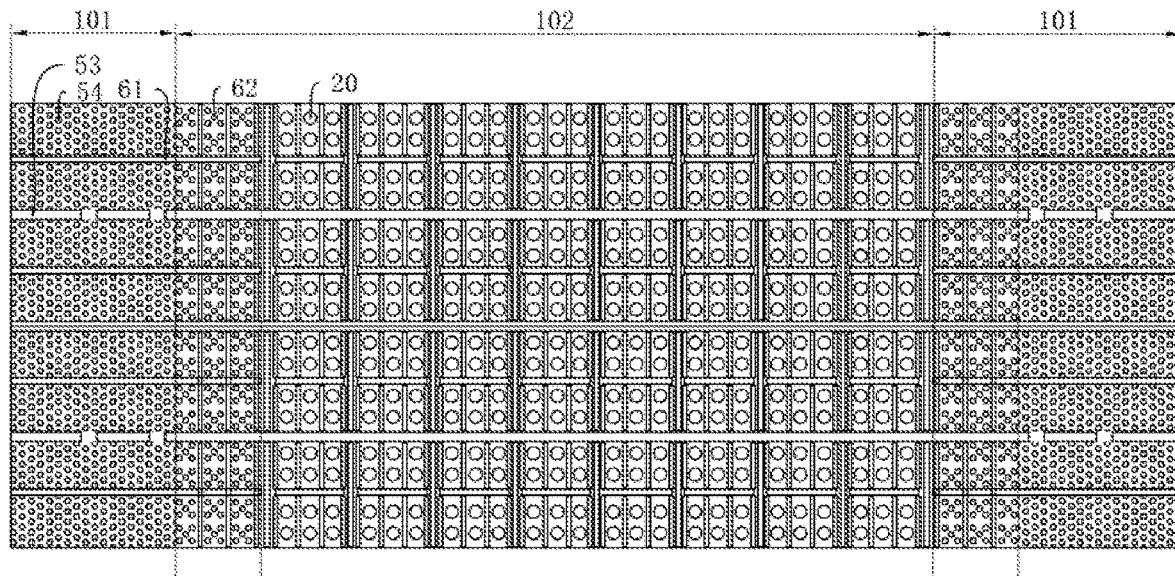
FIG. 5 is a schematic diagram of a top view structure of a part of region of the semiconductor device provided by the implementation of the present disclosure.
Figure 6:
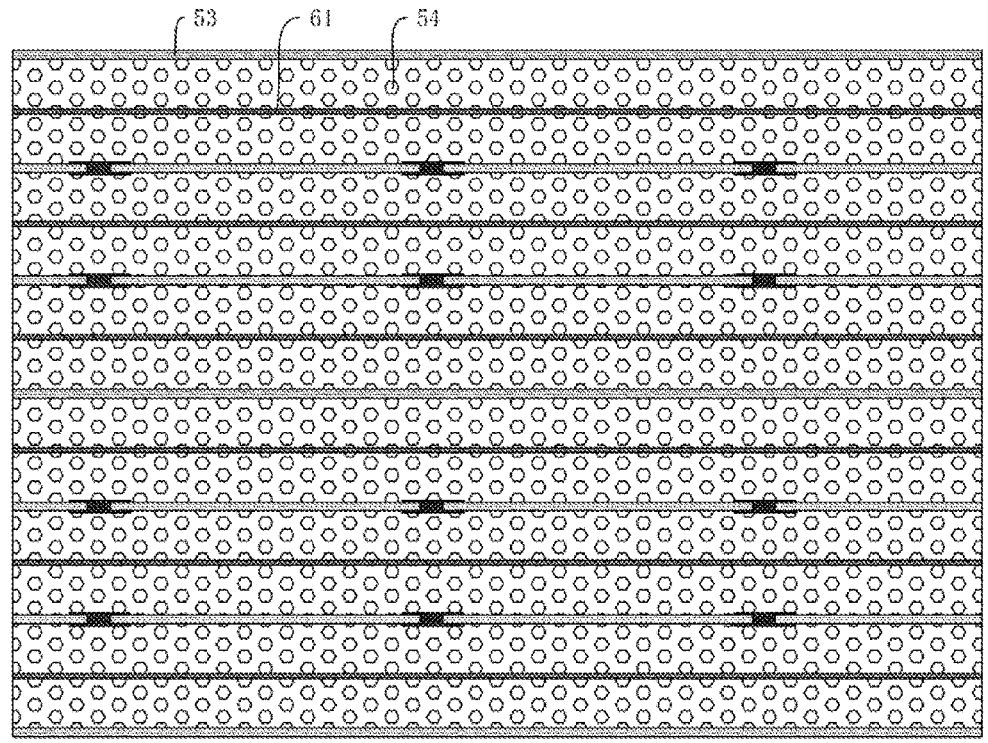
FIG. 6 is a schematic diagram of another top view structure of a part of region of a semiconductor device provided by an exemplary implementation of the present disclosure.

Specifically, referring to FIG. 4, FIG. 5 and FIG. 6, FIG. 4 shows a top view of a semiconductor device 700, wherein the semiconductor device 700 includes one or more array regions 101, and a staircase region 102 may be included between two adjacent array regions 101.

Further, FIG. 5 shows a schematic diagram of the partially enlarged top view structure of the above semiconductor device 700 at the array region 101 and the staircase region 102, and FIG. 6 shows a schematic diagram of the partially enlarged top view structure of the above semiconductor device 700 at the array region 101, wherein the array region 101 can be divided into a plurality of blocks by a gate slit 53, and each block can be divided into a plurality of sub-regions by a top selection gate groove 61, and a plurality of channel structures 54 may be included in each sub-region.

In one implementation, there are a plurality of dummy channel structures 62 on the side of the staircase region 102 close to the array region 101, which can be used to buffer stress and improve the reliability of the semiconductor device 700. The staircase region 102 may include a plurality of staircases 10, and a first conductive pillar 20 is arranged corresponding to each staircase.

In one implementation, support pillars can also be arranged at a plurality of staircases 10 to improve the stability of the stack structure, which will be described in detail in subsequent implementations.

Figure 7:
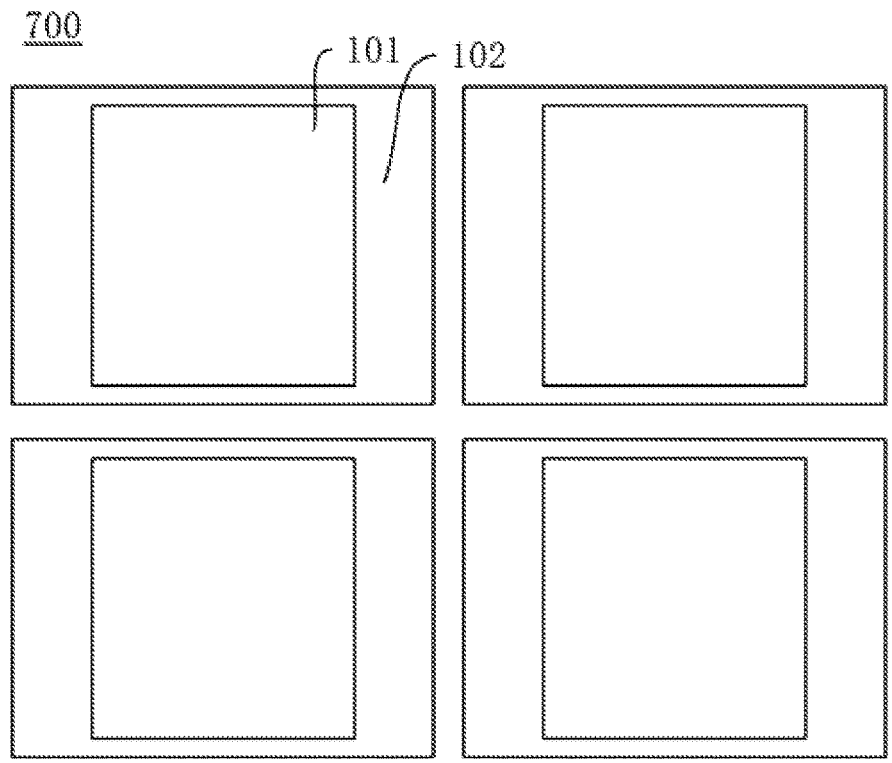
FIG. 7 is a schematic diagram of another top view structure of a semiconductor device provided by an exemplary implementation of the present disclosure.

In addition, FIG. 7 shows a top view of another semiconductor device 700, wherein in the semiconductor device 700, the staircase region 102 may be on both sides of the array region 101. It can be understood that the semiconductor device provided in the implementation of the present disclosure can be applied to any one of the structures in FIG. 4 and FIG. 7.

Figure 8:
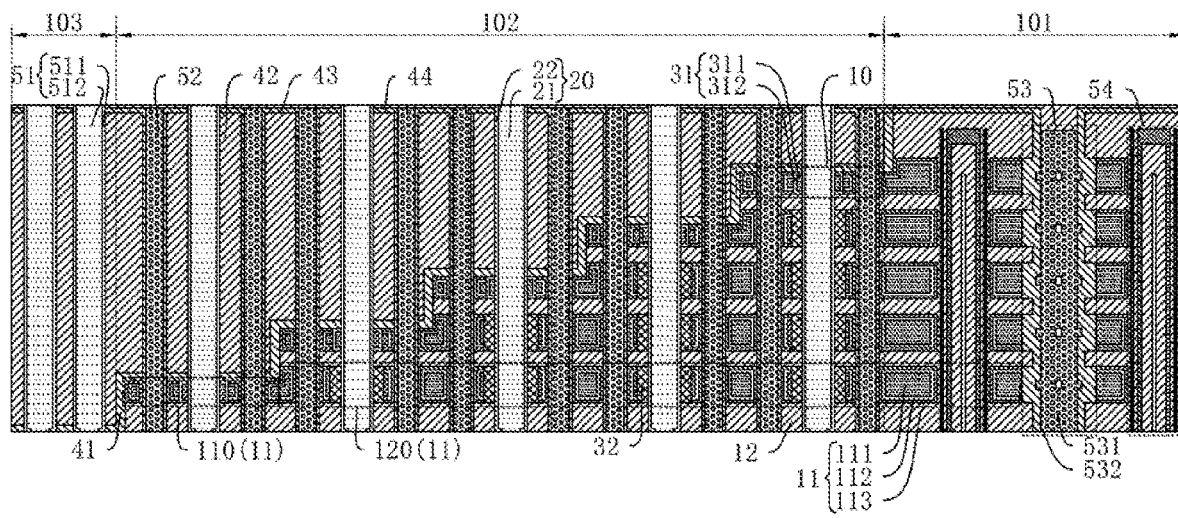
FIG. 8 is a schematic diagram of another cross-sectional structure of a part of region of a semiconductor device provided by an exemplary implementation of the present disclosure.
Figure 9:
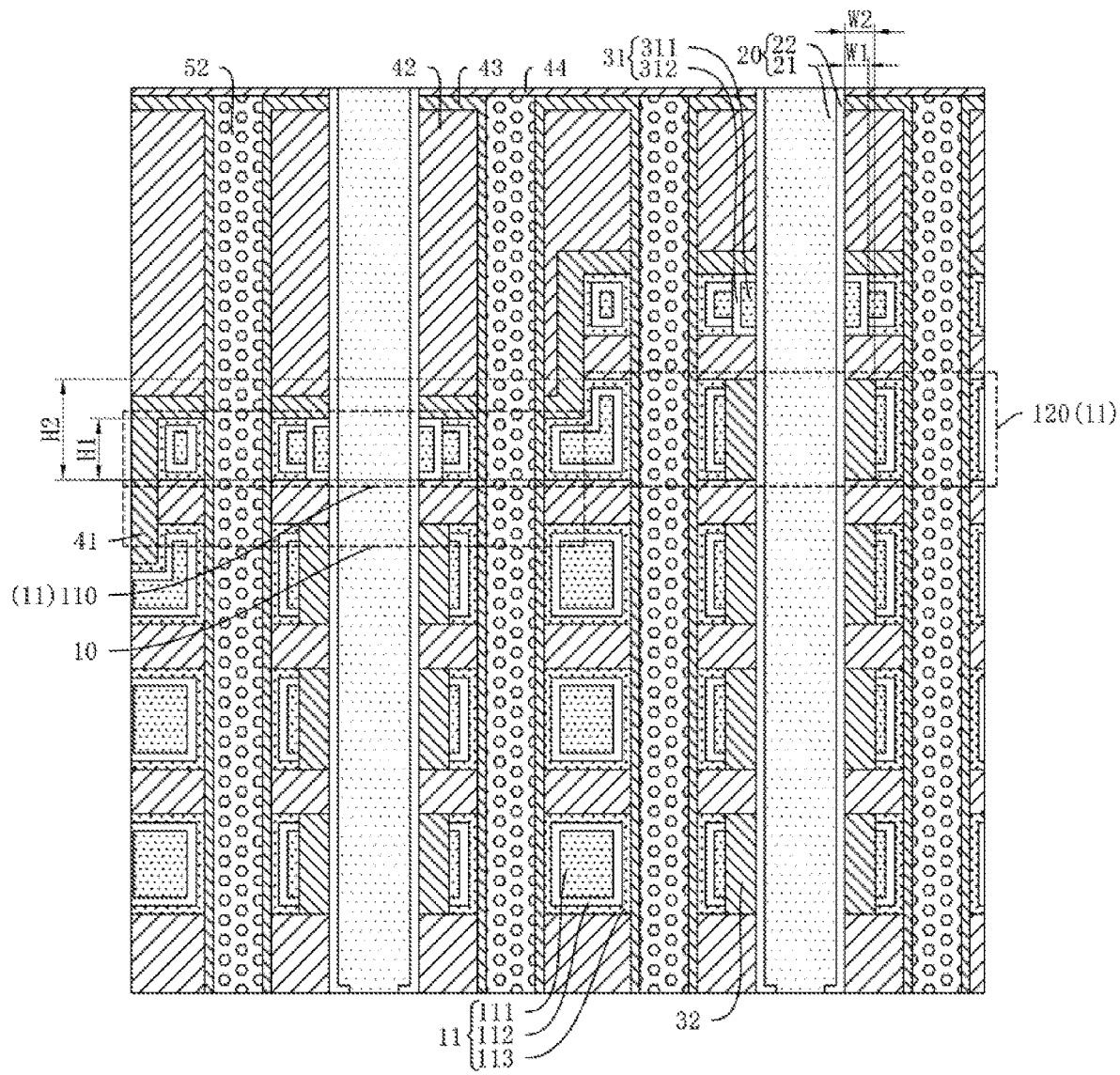
FIG. 9 is a schematic diagram of a partially enlarged cross-sectional structure of a semiconductor device in the staircase region provided by an exemplary implementation of the present disclosure.

Further, the implementation of the present disclosure mainly improves the structure of the semiconductor device in the staircase region 102. Referring to FIG. 3, FIG. 8 and FIG. 9, in the implementation of the present disclosure, the semiconductor device includes a stack structure, which includes an array region 101 and a staircase region 102 adjoining the array region 101.

Therein, the semiconductor device comprises a substrate (not shown in the FIG.) and a stack structure arranged on the substrate. The substrate includes, but is not limited to, Si substrate, Ge substrate, SiGe substrate, silicon on insulator (SOI) substrate or germanium on insulator (GOI) substrate, etc. and it can also be a silicon layer added after the formation of the stack structure. Therefore, the semiconductor layer can be used here to include these possible structures.

The stack structure includes a plurality of gate layers 11 and interlayer insulating layers 12 arranged alternately along the stack direction X. The gate layer 11 includes a conductive layer and a first dielectric layer 113 covering a part of the surface of the conductive layer, wherein the first dielectric layer 113 may be between the conductive layer and the interlayer insulation layer 12 to achieve a better blocking effect on metal atoms in the conductive layer, and the first dielectric layer 113 is a dielectric layer with a high dielectric constant, such as a dielectric material with a dielectric constant K greater than 3.9. The conductive layer includes a metal sublayer 111 and a adhesive buffer sublayer 112 between the metal sublayer 111 and the first dielectric layer 113.

The semiconductor device further includes a peripheral region 103 on the side of the staircase region 102 away from the array region 101, an isolation layer 41 covering a plurality of staircases 10, and a dielectric layer 42 covering a plurality of staircases 10 and extending to the peripheral region 103.

In one implementation, the material of the interlayer insulation layer 12 may include silicon oxide material, the metal sublayer 111 may be tungsten, and may also include polysilicon or metal silicide material. For example, the metal silicide material may be provided as a silicide material including a metal selected from tungsten and titanium. The material of the adhesive buffer sublayer 112 may include titanium nitride, the material of the first dielectric layer 113 may include aluminum oxide or zirconium oxide, and the materials of the isolation layer 41 and the dielectric layer 42 may include a silicon oxide material.

Further, the semiconductor device also includes a gate slit 53 penetrating through the stack structure and a channel structure 54 in the array region 101. It can be understood that the gate slit 53 can be filled with a semiconductor layer and an oxide layer covering the side wall of the semiconductor layer, wherein the material of the semiconductor layer can include a polysilicon material, and the material of the oxide layer can include a silicon oxide material.

The channel structure 54 is formed in the channel hole, and can include a charge storage layer, a tunneling layer and a channel layer from the outside to the inside, and filling materials can be further deposited in the channel hole to completely or partially fill the channel hole to form the channel structure 54.

In one implementation, the material of the tunneling layer may include silicon oxide, the material of the charge storage layer may include silicon nitride or silicon oxynitride, the material of the channel layer may include polysilicon, and the filling material may include silicon oxide or other dielectric materials.

In one implementation, the gate layer 11 includes a conductive layer, but does not include the first dielectric layer 113 which can be selectively arranged in the channel hole.

In addition, a plurality of staircases 10 corresponding to the plurality of gate layers 11 one-to-one can be formed in the staircase region 102 of the stack structure. In the implementation of the present disclosure, each gate layer 11 includes a first gate part 110 at the corresponding staircase 10 and a second gate part 120 connected to the first gate part 110 and extending into the array region 101. Therein, the thickness H1 of the first gate part 110 along the stack direction X is less than the thickness H2 of the second gate part 120 along the stack direction X.

In one implementation, the total thickness of the metal sublayer 111, the adhesive buffer sublayer 112, and the first dielectric layer 113 in the first gate part 110 is less than the total thickness of the metal sublayer 111, the adhesive buffer sublayer 112, and the first dielectric layer 113 in the second gate part 120.

Further, the semiconductor device provided by the implementation of the present disclosure further includes a plurality of first conductive pillars 20 arranged in the staircase region 102, each of the first conductive pillars 20 penetrates through the stack structure along the stack direction X, that is, each of the first conductive pillars 20 penetrates through a plurality of gate layers 11 along the stack direction X, wherein the plurality of first conductive pillars 20 correspond, one-to-one, to the plurality of first gate parts 110 at the plurality of staircases 10 and are electrically connected with them. Correspondingly, the first conductive pillar 20 is also insulated from at least one second gate part 120 on one side of the first gate part 110 along the stack direction X, so that a plurality of first conductive pillars 20 can be electrically connected to a plurality of gate layers 11. By thinning the thickness of the first gate part 110, the implementation of the present disclosure can ensure that the first gate part 110 at the staircase 10 can be fully filled during the formation process, reducing the risk of the occurrence of voids in the first gate part 110 and further reducing the risk of poor conducting between the first conductive pillar 20 and the first gate part 110.

It should be noted that the first conductive pillar 20 penetrates through the dielectric layer 42, the isolation layer 41 and the stack structure along the stack direction X.

Specifically, the semiconductor device includes a conducting part 31 between the first conductive pillar 20 and the first gate part 110 and arranged around the first conductive pillar 20, and an insulating part 32 between the first conductive pillar 20 and the second gate part 120 and arranged around the first conductive pillar 20, wherein the first gate part 110 is arranged around the conducting part 31 and is in contact with the conducting part 31, and the second gate part 120 is arranged around the insulating part 32 and is insulated from the first conductive pillar 20 through the insulating part 32.

Therein, the plurality of first conductive pillars 20 include one first conductive pillar 20 penetrating through one gate layer 11 along the stack direction X, and a conducting part 31 is arranged between the first conductive pillar 20 and the first gate part 110. The other first conductive pillars 20 penetrate at least two gate layers 11 along the stack direction X, and a conducting part 31 is arranged between the other first conductive pillars 20 and the first gate part 110 of one of the gate layers 11, and an insulating part 32 is arranged between the other first conductive pillars 20 and the second gate part 120 of the other gate layers 11.

It can be understood that the plurality of first conductive pillars 20 include a plurality of first conductive pillars 20 penetrating through at least two gate layers 11 along the stack direction X and one first conductive pillar 20 penetrating through one gate layer 11 along the stack direction X, wherein among the plurality of first conductive pillars 20 penetrating through at least two gate layers 11 along the stack direction X, each first conductive pillar 20 is electrically connected with one gate layer 11 through the conducting part 31 and is insulated from the other gate layers 11 through the insulating part 32. In the one first conductive pillar 20 penetrating through one gate layer 11 along the stack direction X, the first conductive pillar 20 is electrically connected with the one gate layer 11 which it penetrates through via the conducting part 31. In the implementation of the present disclosure, a plurality of first conductive pillars 20 can directly penetrate through the stack structure, thereby reducing the demand for etching accuracy, reducing the process difficulty and improving the yield.

In one implementation, the conducting part 31 includes a conductive sub-part 311 and a first adhesive buffer sub-part 312, the first adhesive buffer sub-part 312 is between the first gate part 110 and the conductive sub-part 311, and the conductive sub-part 311 is between the first conductive pillar 20 and the first adhesive buffer sub-part 312. Therein, the conductive layer is exposed on the surface of the first gate part 110 on the side close to the conducting part 31, that is, the metal sublayer 111 is exposed, and the metal sublayer 111 is enabled to be in direct contact with the conducting part 31, that is, in direct contact with the first adhesive buffer sub-part 312, so that the first gate part 110 can be electrically connected with the conducting part 31. The conductive layer is exposed on the surface of the second gate part 120 on the side close to the insulating part 32, that is, the metal sublayer 111 is exposed, and the metal sublayer 111 is enabled to be in contact with the insulating part 32, and the insulating part 32 completely covers the surface of the metal sublayer 111 on the side close to the first conductive pillar 20, so that the second gate part 120 can be arranged separately from the first conductive pillar 20 through the insulating part 32.

In one implementation, the first conductive pillar 20 includes a conductive body 21 and a second adhesive buffer sub-part 22 covering the conductive body 21, and the second adhesive buffer sub-part 22 is between the conductive sub-part 311 and the conductive body 21, so that the first conductive pillar 20 is electrically connected with the conducting part 31, and thus the first conductive pillar 20 can be electrically connected with the first gate part 110 through the conducting part 31.

Therein, the material of the conductive sub-part 311 and the material of the conductive body 21 may include tungsten, and the material of the first adhesive buffer sub-part 312 and the material of the second adhesive buffer sub-part 22 may include titanium nitride.

In one implementation, the thickness of the conducting part 31 along the stack direction X is equal to that of the first gate part 110 along the stack direction X, and thus the thickness of the conducting part 31 along the stack direction X is greater than that of the conductive layer in the first gate part 110 along the stack direction X, while the thickness of the insulating part 32 along the stack direction X is equal to that of the second gate part 120 along the stack direction X.

Since the thickness of the first gate part 110 along the stack direction X is greater than that of the second gate part 120 along the stack direction X, the thickness of the conducting part 31 along the stack direction X is less than that of the insulating part 32 along the stack direction X. It should be noted that, by reducing the thickness of the first gate part 110 to be less than that of the second gate part 120, the implementation of the present disclosure can reduce the thickness of the groove that needs to be filled when the conducting part 31 is formed, so that the conducting part 31 can fill up the entire groove, thereby improving the success rate of the electrical connection between the conducting part 31 and the first conductive pillar 20.

Further, the width W1 of the conducting part 31 along the first direction Y is smaller than the width W2 of the insulating part 32 along the first direction Y, and the first direction Y is perpendicular to the stack direction X.

In the implementation of the present disclosure, the semiconductor device further comprises: a support pillar 52 arranged in the staircase region 102 and penetrating through the dielectric layer 42, the isolation layer 41 and the stack structure; an oxide layer 43 covering the side wall of the support pillar 52, the upper surface of the dielectric layer 42 and the upper surface of the stack structure; and a cover layer 44 covering the upper surface of the oxide layer 43. Because in the implementation of the present disclosure, a plurality of first conductive pillars 20 all penetrate through the stack structure, in order to improve the stability of the stack structure, in the implementation of the present disclosure, the support pillar 52 is arranged in the staircase region 102 to improve the stability of the stack structure and the reliability of the semiconductor device.

In one implementation, each staircase 10 is correspondingly provided with at least one support pillar 52.

In one implementation, the material of the support pillar 52 may include a polysilicon material, and the materials of the oxide layer 43 and the cover layer 44 may include a silicon oxide material.

Further, the semiconductor device also includes a second conductive pillar 51 arranged in the peripheral region 103 and penetrating through the dielectric layer 42 and the isolation layer 41 along the stack direction X. It should be noted that the material of the second conductive pillar 51 can be the same as that of the first conductive pillar 20, that is, the second conductive pillar 51 can include a conductive column made of tungsten and a third adhesive buffer subpart covering the side wall of the conductive column and made of titanium nitride. Thus, the first conductive pillar 20 and the second conductive pillar 51 can be prepared in the same process to simplify the process, reduce the process time and reduce the process cost.

Following the above, in the implementation of the present disclosure, a plurality of first conductive pillars 20 penetrating through the stack structure are arranged in the staircase region 102, and each first conductive pillar 20 is electrically connected with the first gate part 110 of the gate layer 11 at one staircase 10 correspondingly, so that the plurality of first conductive pillars 20 correspond to the plurality of gate layers 11 one-to-one and are electrically connected with them. That is, the first conductive pillar 20 in the implementation of the present disclosure directly penetrates through the stack structure, and it is not necessary to accurately control the first conductive pillar 20 to fall on each staircase 10. Therefore, the implementation of the present disclosure can avoid the occurrence of the phenomenon of short circuit between different gate layers 11 caused by the etching accuracy of the contact hole of the first conductive pillar 20, and improve the yield of semiconductor devices.

In addition, the implementation of the present disclosure also provides a manufacturing method of a semiconductor device. Referring FIG. 3, FIG. 8, FIG. 9 and FIG. 10, the manufacturing method of the semiconductor device includes:

Forming a stack structure. The stack structure includes a plurality of interlayer insulating layers 12 and a plurality of gate layers 11 formed alternately along the stack direction X. The stack structure includes an array region 101 and a staircase region 102 adjoining the array region 101. A plurality of staircases 10 corresponding to the gate layers 11 are formed in the staircase region 102 of the stack structure. Each gate layer 11 includes a first gate part 110 at the corresponding staircase 10 and a second gate part 120 connected to the first gate part 110, and the thickness of the first gate part 110 along the stack direction X is less than the thickness of the second gate part 120 along the stack direction.

Forming, in the staircase region 102, a first conductive pillar 20 penetrating through the stack structure along the stack direction X, the first conductive pillar 20 being electrically connected with the first gate part 110.

That is, the implementation of the present disclosure realizes the electrical connection between the first conductive pillar 20 and the corresponding gate layer 11 by forming the first conductive pillar 20 as penetrating through the stack structure and electrically connecting the first gate part 110 at the staircase 10, thus it is not necessary to accurately control the first conductive pillar 20 to fall on each staircase 10, that is, the implementation of the present disclosure can avoid the occurrence of the phenomenon of short circuit between different gate layers 11 caused by the etching accuracy of the contact hole of the first conductive pillar 20, and improve the yield of the semiconductor device. By thinning the thickness of the first gate part 110, the implementation of the present disclosure can ensure that the first gate part 110 at the staircase 10 can be fully filled during the formation process, reducing the risk of the occurrence of voids in the first gate part 110 and further reducing the risk of poor conducting between the first conductive pillar 20 and the first gate part 110.

Specifically, referring to FIG. 3, FIG. 8, FIG. 9, FIG. 10, FIG. 11 to FIG. 20, the manufacturing method of the semiconductor device includes:

S10: A stack structure including a plurality of interlayer insulating layers 12 and a plurality of gate layers 11 formed alternately along the stack direction X is formed. The stack structure includes an array region 101 and a staircase region 102 adjoining the array region 101. A plurality of staircases 10 corresponding to the gate layers 11 are formed in the staircase region 102 of the stack structure. Each gate layer 11 includes a first gate part 110 at the corresponding staircase 10 and a second gate part 120 connected to the first gate part 110, and the thickness of the first gate part 110 along the stack direction X is less than that of the second gate part 120 along the stack direction.

In step S10, a substrate (not shown in the FIGS.) is first provided, and the substrate includes but not limited to Si substrate, Ge substrate, SiGe substrate, silicon on insulator (SOI) substrate or germanium on insulator (GOI) substrate, etc.

A plurality of interlayer insulating layers 12 and gate sacrificial layers 13 laminated along the stack direction X are formed on the substrate.

Then, a channel structure 54 is formed in the stack structure corresponding to the array region 101, wherein the channel structure 54 is formed in the channel hole and can include a charge storage layer, a tunneling layer and a channel layer from the outside to the inside, and filling materials can be further deposited in the channel hole to completely or partially fill the channel hole to form the channel structure 54.

In one implementation, the material of the tunneling layer may include silicon oxide, the material of the charge storage layer may include silicon nitride or silicon oxynitride, the material of the channel layer may include polysilicon, and the filling material may include silicon oxide or other dielectric materials.

Next, the parts of the plurality of interlayer insulating layers 12 and the plurality of gate sacrificial layers 13 in the staircase region 102 are etched to form a plurality of initial staircases 1100 in the staircase region 102. Each initial staircase 1100 includes one gate sacrificial layer 13 and one interlayer insulating layer 12 in the staircase region 102 and laminated. Therein, the material of the interlayer insulation layer 12 includes silicon oxide material, and the material of the gate sacrificial layer 13 includes silicon nitride material, as shown in FIG. 11.

Figure 12:
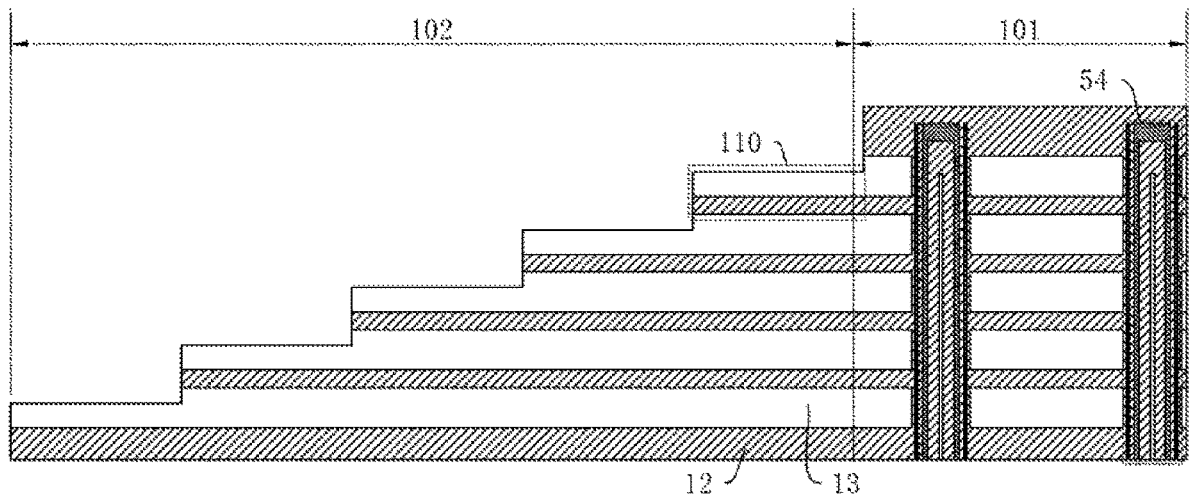

Then, the gate sacrificial layer 13 at each initial staircase 1100 is thinned so that the thickness of the gate sacrificial layer 13 at the initial staircase 1100 becomes smaller and less than the thickness of the gate sacrificial layer 13 outside the initial staircase 1100, as shown in FIG. 12.

Next, the isolation layer 41 is deposited to cover the plurality of initial staircases 1100, and the dielectric layer 42 is deposited to cover the isolation layer 41 and extend to the peripheral region 103 of the semiconductor device.

In one implementation, the material of the isolation layer 41 and the material of the dielectric layer 42 may include a silicon oxide material.

Using the same process, a plurality of first contact holes 401, a plurality of second contact holes 402 are formed in the staircase region 102, and a plurality of third contact holes 403 and a gate slit structure 404 are formed in the peripheral region 103. The first contact holes 401, the second contact holes 402 penetrate through the dielectric layer 42, the isolation layer 41, the plurality of interlayer insulation layers 12 and the plurality of gate sacrificial layers 13 along the stack direction X, the third contact holes 403 penetrates through the dielectric layer 42 along the stack direction X, and the gate slit structure 404 penetrates through the plurality of interlayer insulating layers 12 and the plurality of gate sacrificial layers 13 along the stack direction X.

It should be noted that the first contact hole 401 and the second contact hole 402 can directly penetrate through the stack structure, and thus reduce the demand for etching accuracy, reduce the process difficulty and improve the yield.

Figure 13:
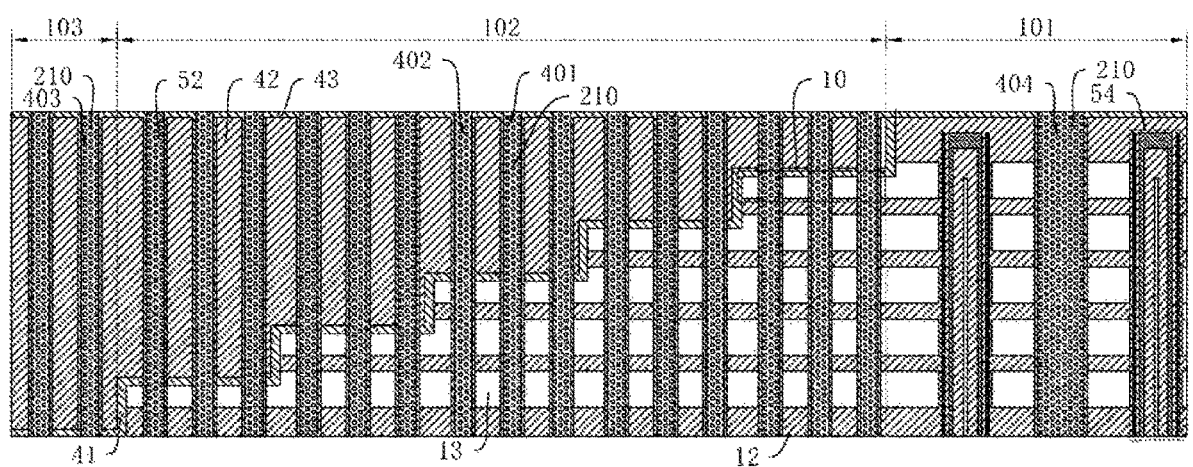

Then, an intermediate column 210 is formed in the first contact hole 401, the third contact hole 403, and the gate slit structure 404, and a support pillar 52 is formed in the second contact hole 402. Therein, the material of the intermediate column 210 and the material of the support pillar 52 may include polysilicon material, and when depositing the intermediate column 210 and the support pillar 52, an oxide layer 43 may be formed on the inner walls of the first contact hole 401, the second contact hole 402, the third contact hole 403, and the gate slit structure 404, and on the upper surface of the dielectric layer 42, and the oxide layer 43 may be a silicon oxide layer, as shown in FIG. 13.

Next, the gate sacrificial layer 13 is removed to form a plurality of slots.

Further, a plurality of gate layers 11 are formed in the plurality of slots to obtain a stack structure. Therein, the step of forming the gate layer 11 includes forming a first dielectric layer 113 and a conductive layer, and the first dielectric layer 113 covers a part of the surface of the conductive layer, wherein the first dielectric layer 113 can be between the conductive layer and the interlayer insulation layer 12, so as to achieve a better blocking effect on the metal atoms in the conductive layer. The conductive layer includes a metal sublayer 111 and a adhesive buffer sublayer 112 between the metal sublayer 111 and the interlayer insulation layer 12.

Therein, a plurality of staircases 10 corresponding to a plurality of gate layers 11 are formed in the staircase region 102 of the stack structure. It can be understood that the plurality of formed staircases 10 can correspond to the plurality of initial staircases 1100 one-to-one. The gate layer 11 includes a first gate part 110 at the corresponding staircase 10 and a second gate part 120 connected to the first gate part 110. Since the part of the gate sacrificial layer 13 at the initial staircase 1100 is thinned in the implementation of the present disclosure, after the gate layer 11 is formed, the thickness of the first gate part 110 at the staircase 10 along the stack direction X is less than the thickness of the second gate part 120 along the stack direction X. That is, by thinning the thickness of the first gate part 110, the implementation of the present disclosure can ensure that the first gate part 110 at the staircase 10 can be fully filled during the formation process, reducing the risk of the occurrence of voids in the first gate part 110 and further reducing the risk of poor conducting between the first conductive pillar 20 and the first gate part 110.

In one implementation, the metal sublayer 111 may be tungsten, and may also include polysilicon or a metal silicide material. For example, the metal silicide material may be provided as a silicide material including a metal selected from tungsten and titanium, the material of bonding the buffer sublayer 112 may include titanium nitride, and the material of the first dielectric layer 113 may include aluminum oxide or zirconium oxide.

Next, the oxide layer 43 and the intermediate column 210 in the gate slit structure 404, as well as a part of the film layers of the plurality of gate layers 11 are removed. For example, the first dielectric layer 113, the adhesive buffer sublayer 112 and a part of the metal sublayer 111 of the gate layer 11 on the side close to the gate slit structure 404 are removed to expose the metal sublayer 111 on the side close to the gate slit structure 404.

Figure 14:
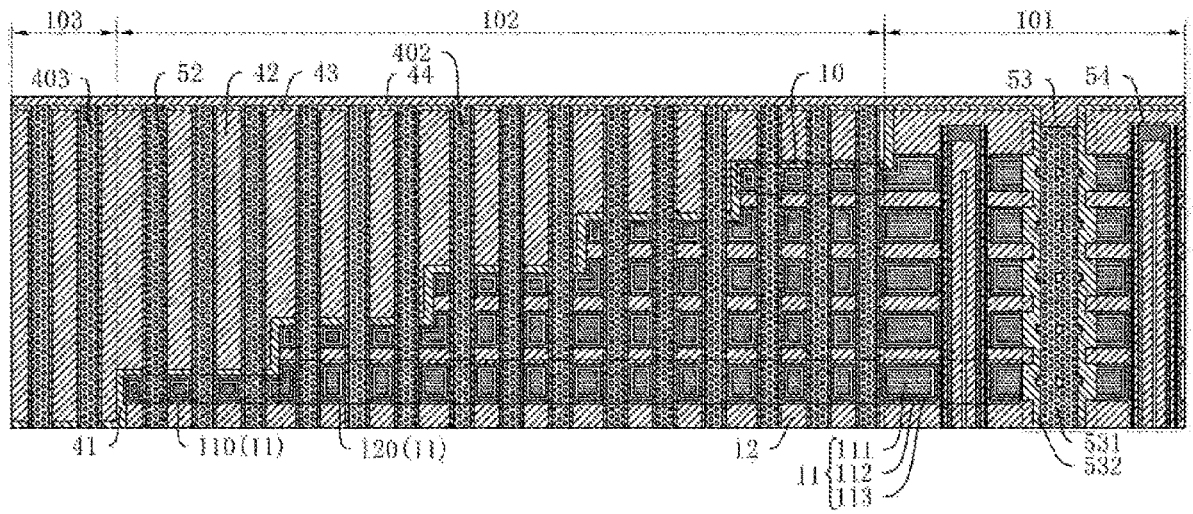

Then, an insulating oxide layer 532 and a filler 531 are deposited in the gate slit structure 404 to form a gate slit 53, and the insulating oxide layer 532 covers the side wall of the filler 531. A cover layer 44 is deposited on the oxide layer 43 and the gate slit 53, as shown in FIG. 14.

In one implementation, the material of the cover layer 44 may include a silicon oxide material, the material of the insulating oxide layer 532 may include a silicon oxide material, and the material of the filler 531 may include a polysilicon material.

Figure 15:
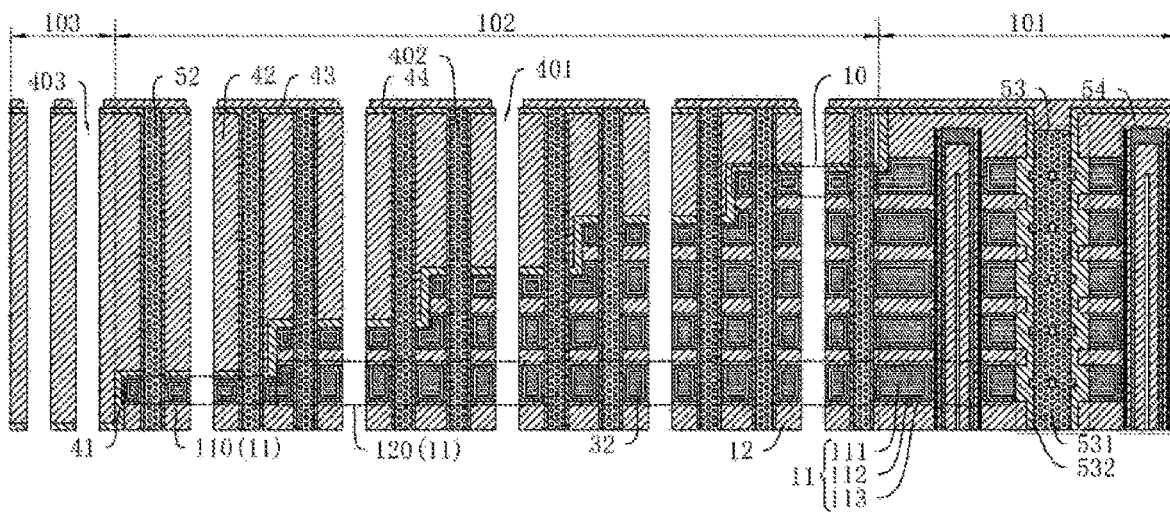

Further, the intermediate column 210 in the first contact hole 401 and the intermediate column 210 in the third contact hole 403 are removed, as shown in FIG. 15.

Figure 16:
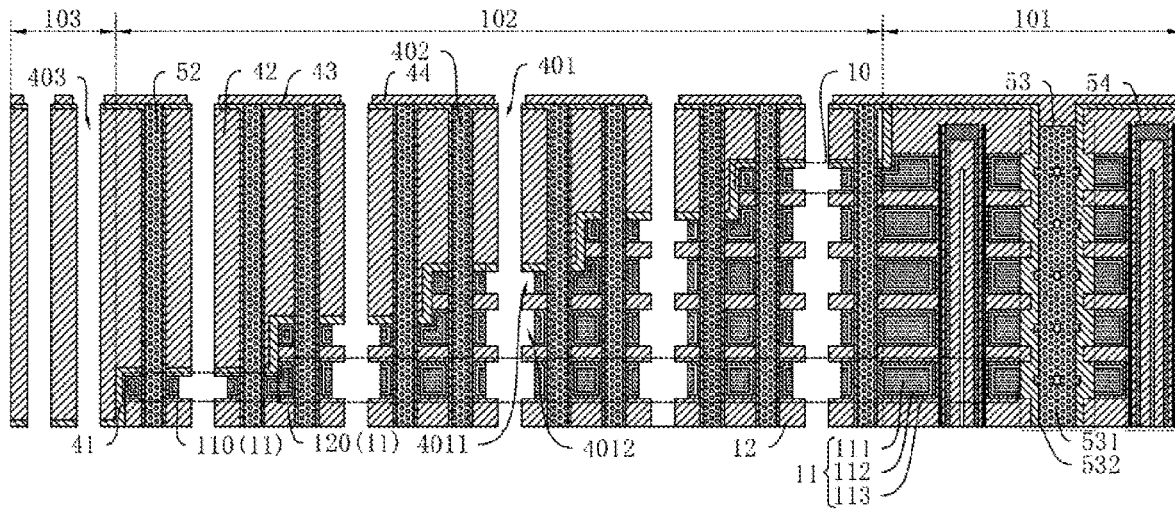

The plurality of first contact holes 401 include one first contact hole 401 penetrating through one gate layer 11 along the stack direction X, and the first contact hole 401 is at the outermost periphery of the staircase region 102. The first gate part 110 is etched in the first contact hole 401 to form a first groove 4011. The other first contact holes 401 penetrate through at least two gate layers 11 along the stack direction X, and then the first gate part 110 of one of the gate layers 11 is etched in the other first contact holes 401 to form a first groove 4011, and the second gate parts 120 of the other gate layers 11 are etched to form second grooves 4012, and the plurality of first grooves 4011 correspond to the first gate parts 110 of the plurality of gate layers 11 one-to-one, as shown in FIG. 16.

Therein, the inner wall of the first groove 4011 exposes the metal sublayer 111 in the first gate part 110, and the inner wall of the second groove 4012 exposes the metal sublayer 111 in the second gate part 120.

S20: A plurality of first conductive pillars 20 penetrating through the stack structure along the stack direction X are formed in the staircase region 102, and the first conductive pillars 20 are electrically connected with the first gate parts 110.

Figure 17:
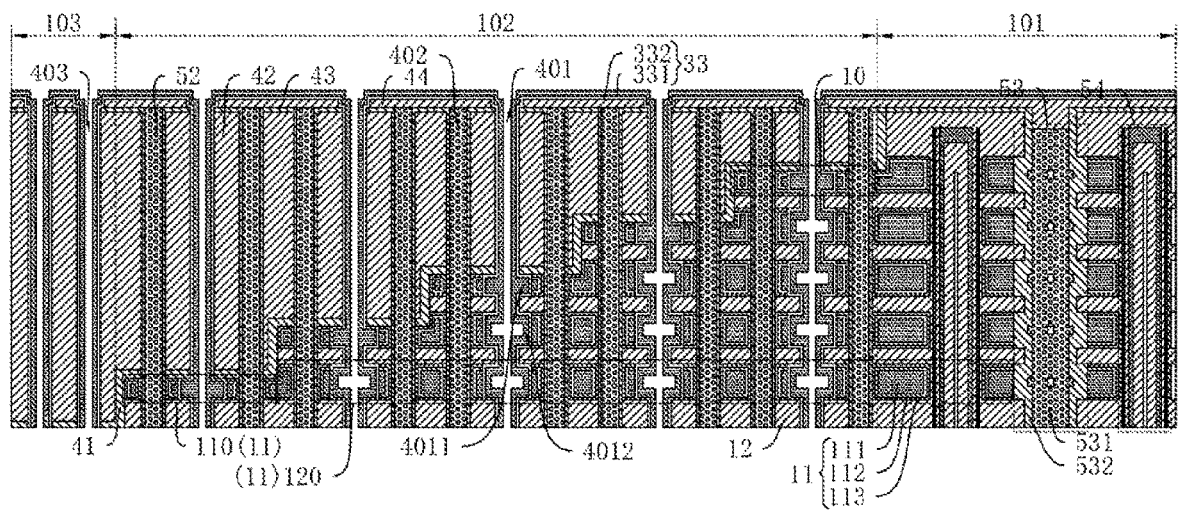

In step S20, a conductive functional material layer 33 is formed in a plurality of first contact holes 401, and the conductive functional material layer 33 is filled in the first groove 4011 and covers the inner wall of the second groove 4012, and the conductive functional material layer 33 includes a metal material layer 331 and a dielectric layer 332, as shown in FIG. 17.

It should be noted that since the thickness of the first gate part 110 is less than that of the second gate part 120, the size of the first groove 4011 along the stack direction X is less than that of the second groove 4012 along the stack direction X, and thus the conductive functional material layer 33 can be completely filled in the first groove 4011 and cover along the inner wall of the second groove 4012, and cannot completely fill the second groove 4012.

In one implementation, the material of the metal material layer 331 may include tungsten, and the material of the dielectric layer 332 may include titanium nitride.

Figure 18:
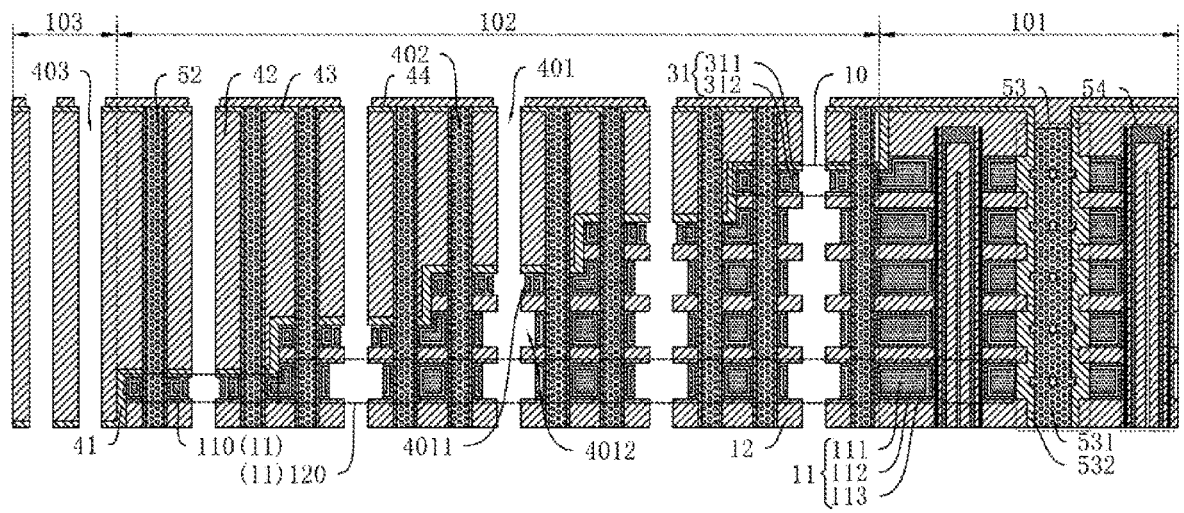

Then, at least the conductive functional material layer 33 outside the first groove 4011 is removed to form a conducting part 31 in the first groove 4011, and the first gate part 110 is around and in contact with the conducting part 31, as shown in FIG. 18.

Therein, the conductive functional material layer 33 outside the first groove 4011 is removed, and a part of the conductive functional material layer 33 in the first groove 4011 is removed, to form a conducting part 31 in the first groove 4011. The conducting part 31 includes a conductive sub-part 311 filled in the first groove 4011, and a first adhesive buffer sub-part 312 covering the inner wall of the first groove 4011 and being between the conductive sub-part 311 and the inner wall of the first groove 4011, and the conductive sub-part 311 is exposed to the inner wall of the first contact hole 401.

It can be understood that in the process of removing the conductive functional material layer 33, it is necessary to control the etching amount in the first groove 4011 along the first direction Y to be less than that in the second groove 4012 along the first direction Y, so as to ensure that the conducting part 31 can be formed in the first groove 4011.

Figure 19:
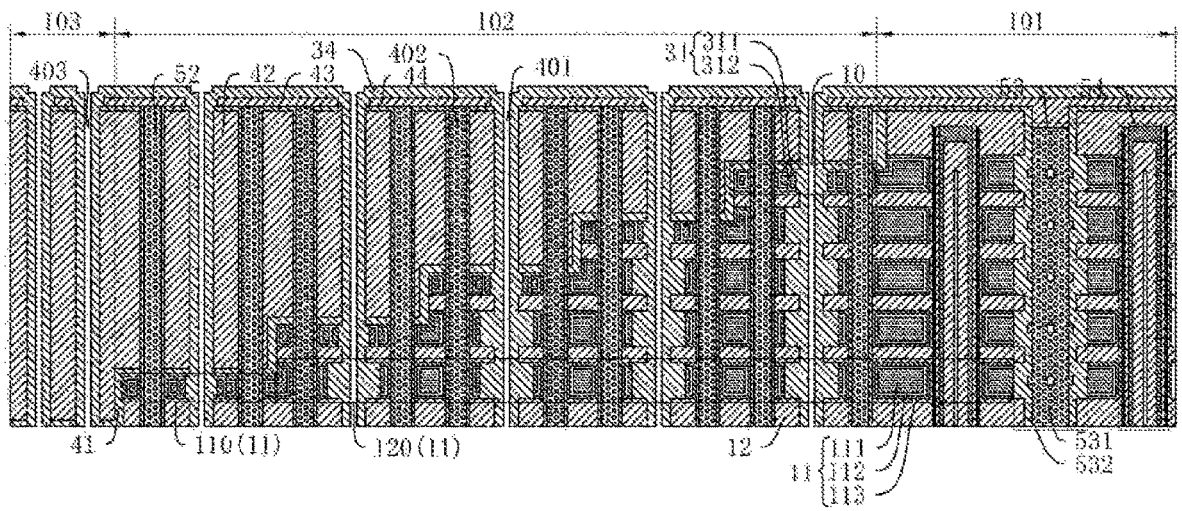

Next, an insulating layer 34 is deposited on the upper surfaces of the first contact hole 401, the third contact hole 403, and the cover layer 44, and the insulating layer 34 continuously covers the first groove 4011 and the second groove 4012, and is filled in the second groove 4012 to cover the metal sublayer 111 of the second gate part 120 exposed at the second groove 4012, as shown in FIG. 19. And the material of the insulating layer 34 may include a silicon oxide material.

Figure 20:
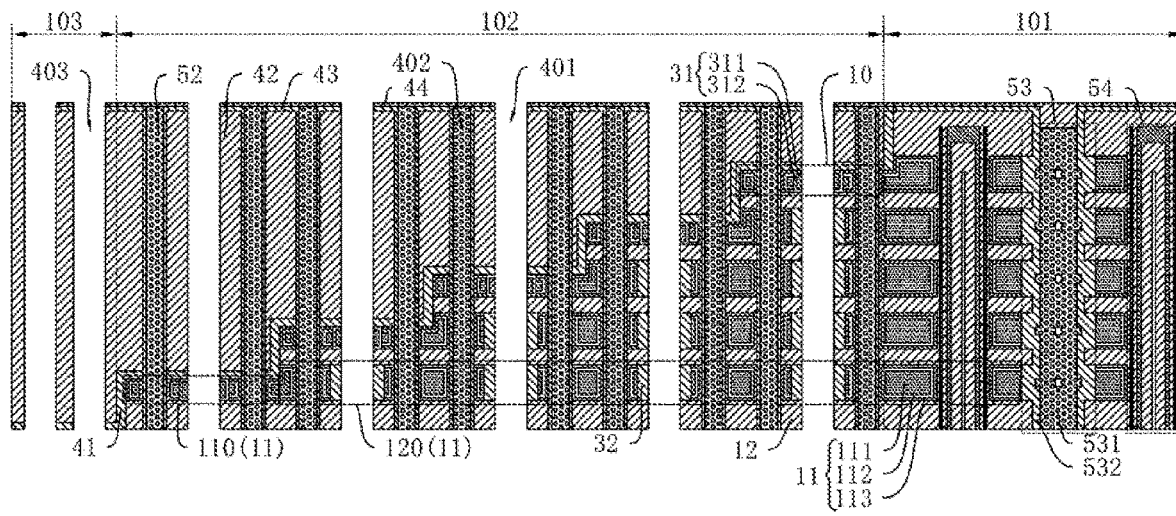

Then, the insulating layer 34 outside the second groove 4012 is removed to form an insulating part 32 in the second groove 4012, and the insulating part 32 is filled in the second groove 4012 and covers the exposed metal sublayer 111 of the second gate part 120, as shown in FIG. 20.

Further, a plurality of first conductive pillars 20 are formed corresponding to each first contact hole 401, and a second conductive pillar 51 is formed in the third contact hole 403, and one first conductive pillar 20 is electrically connected with the first gate part 110 through the conducting part 31 in one corresponding first contact hole 401, as shown in FIG. 8.

Therein, a second adhesive buffer sub-part 22 and a conductive body 21 are formed in turn in the first contact hole 401 to form the first conductive pillar 20; and a third adhesive buffer sub-par 512 and a conductive column 511 are formed in turn in the third contact hole 403. The second adhesive buffer sub-part 22 covers the side wall of the conductive body 21 and is between the conductive sub-part 311 and the conductive body 21, and the third adhesive buffer sub-part 512 covers the side wall of the conductive column 511.

In one implementation, the material of the second adhesive buffer sub-part 22 and the material of the third adhesive buffer sub-part 512 may include titanium nitride, and the material of the conductive body 21 and the material of the conductive column 511 may include tungsten.

Figure 21:
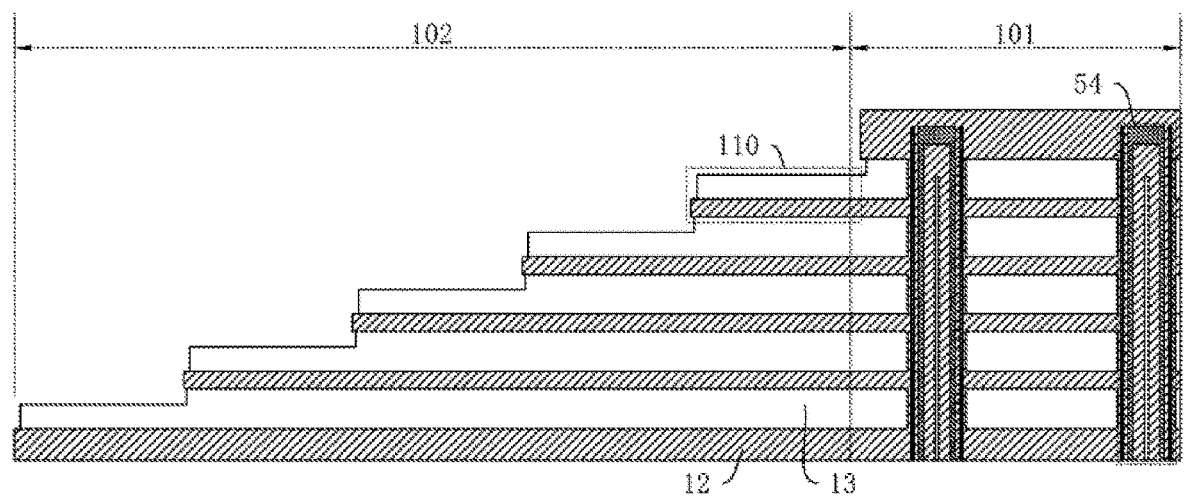
FIG. 21 is a schematic diagram of another cross-sectional structure of a part of region of a semiconductor device provided by an exemplary implementation of the present disclosure.
Figure 22:
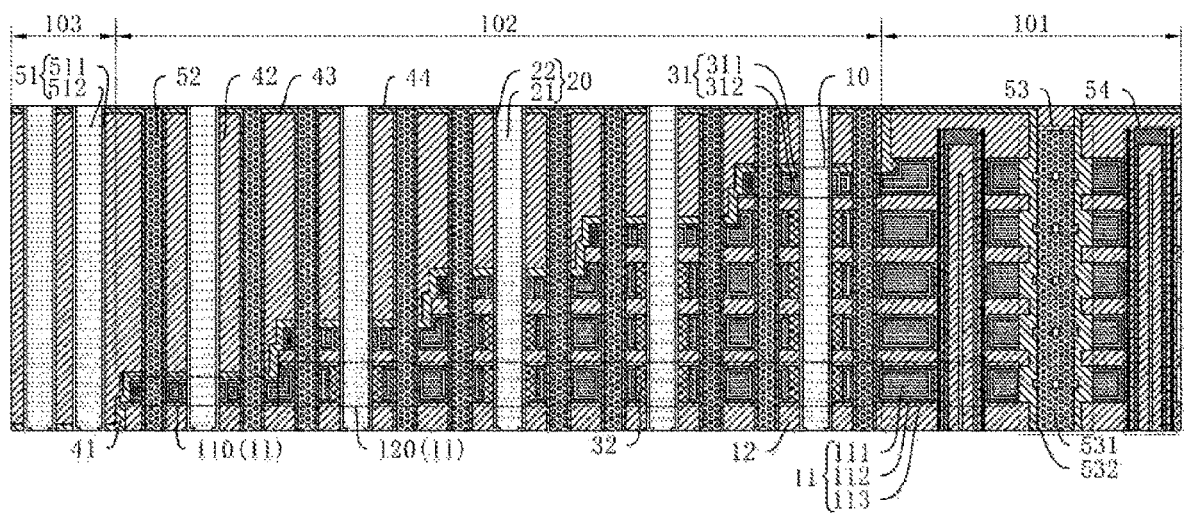
FIG. 22 is a schematic diagram of another cross-sectional structure of a part of region of a semiconductor device provided by an exemplary implementation of the present disclosure.

It should be noted that in the manufacturing method of the above semiconductor device, when the gate sacrificial layer 13 at the initial staircase 1100 is thinned using dry etching, the gate sacrificial layer 13 and the interlayer insulation layer 12 at the initial staircase 1100 can also be etched away at the same time, so that the side wall between the two adjacent initial staircases 1100 is a flush surface, as shown in FIG. 8 and FIG. 11, and when the gate sacrificial layer 13 at the initial staircase 1100 is thinned using wet etching, only a part of the gate sacrificial layer 13 is removed, so that the interlayer insulation layer 12 protrudes from the side wall between the two adjacent initial staircases 1100, and all the film layers formed in the subsequent process conduct covering conformally to the protruding part of the interlayer insulation layer 12, as shown in FIG. 21 and FIG. 22.

Following the above, in the implementation of the present disclosure, a plurality of first conductive pillars 20 penetrating through the stack structure are arranged in the staircase region 102, and each first conductive pillar 20 is correspondingly electrically connected with the first gate part 110 of the gate layer 11 at one staircase 10, so that the plurality of first conductive pillars 20 can correspond to the plurality of gate layers 11 one-to-one and be electrically connected with them. That is, the first conductive pillar 20 in the implementation of the present disclosure directly penetrates through the stack structure, and it is not necessary to accurately control the first conductive pillar 20 to fall on each staircase 10. Therefore, the implementation of the present disclosure can avoid the occurrence of the phenomenon of short circuit between different gate layers 11 caused by the etching accuracy of the contact hole of the first conductive pillar 20, and improve the yield of semiconductor devices.

Figure 23:
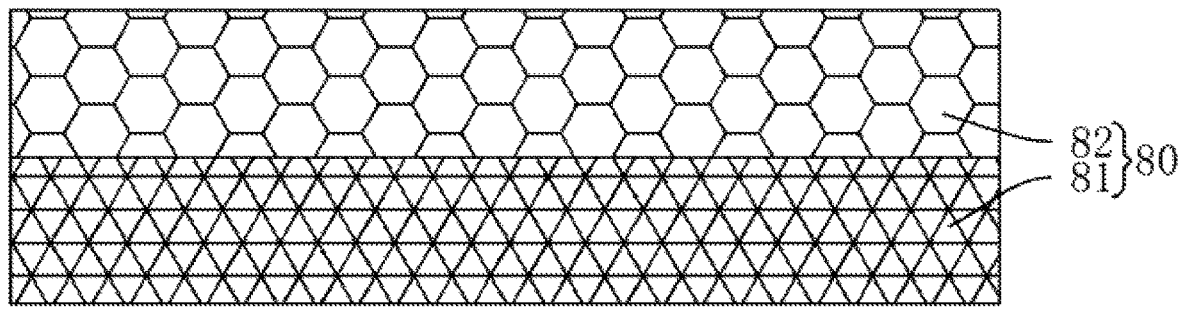
FIG. 23 is a schematic diagram of a structure of a memory provided by an exemplary implementation of the present disclosure.

Accordingly, referring to FIG. 23, the implementation of the present disclosure also provides a memory 80, which includes a memory chip 81 and a peripheral circuit 82. The peripheral circuit 82 is electrically connected with the memory chip 81, and the peripheral circuit 82 can store data in or read data from the memory chip 81. Therein, the memory chip 81 and/or the peripheral circuit 82 may include a semiconductor device in any of the above implementations.

Specifically, the above memory 80 may be specifically a three-dimensional memory (e.g., a 3D NAND memory).

It can be understood that the memory provided by the implementation of the present disclosure has the same beneficial effect as the semiconductor device provided by the implementation of the present disclosure since the semiconductor device is arranged therein.

Figure 24:
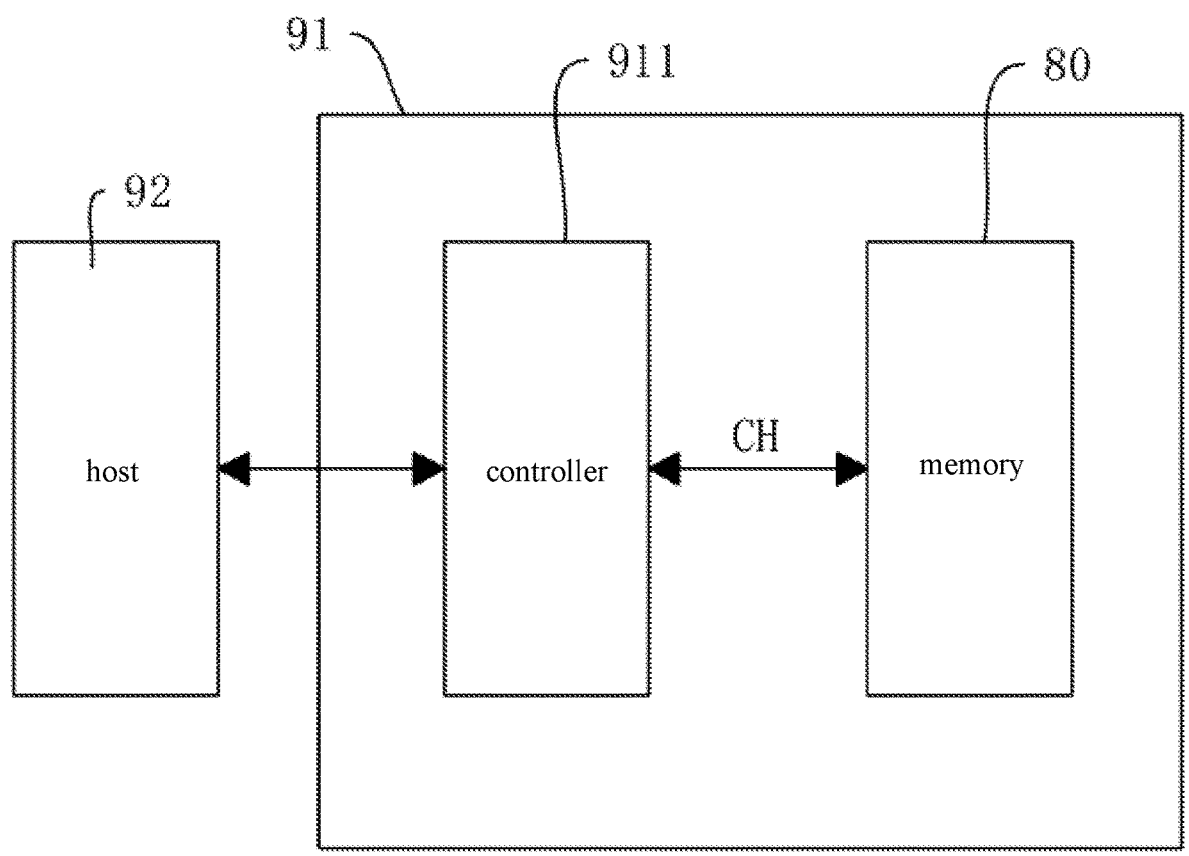
FIG. 24 is a schematic diagram of a structure of a memory system provided by an exemplary implementation of the present disclosure.

In addition, the implementation of the present disclosure also provides a memory system. Referring to FIG. 24, the memory system 91 includes a controller 911 and a memory 80 in any of the above implementations. The controller 911 is coupled to the memory 80 and is used to control the memory 80 to store data.

Specifically, the controller 911 may control the memory 80 through the channel CH, and the memory 80 may perform operations based on the control of the controller 911 in response to a request from the host 92. The memory 80 may receive a command CMD and an address ADDR from the controller 911 through the channel CH and access a region selected from a memory cell array in response to the address. In other words, the memory 80 may perform an internal operation corresponding to the command on the region selected by the address.

In some implementations, the memory system 91 may be implemented as a universal flash memory (UFS) device, a solid state disk (SSD), a multimedia card in the form of MMC, eMMC, RS-MMC, and micro MMC, a secure digital card in the form of SD, mini SD, and micro SD, a memory device of the personal computer memory card International Association (PCMCIA) card type, a memory device of the peripheral component interconnect (PCI) type, a memory device of the high-speed PCI (PCI-E) type, and a compact flash (CF) card, smart media card or memory stick, etc.

Specifically, the above memory system 91 can be used in terminal products such as computers, televisions, set-top boxes, and vehicles.

Further, the implementation of the present disclosure also provides an electronic device, which includes the above memory system 91 provided by the implementation of the present disclosure. Specifically, the electronic device can be any device that can store data, such as mobile phones, desktop computers, tablets, notebooks, servers, vehicular devices, wearable devices, mobile power supplies, etc.

The electronic device provided by the implementation of the present disclosure has the same beneficial effect as the above memory system provided by the implementation of the present disclosure as the memory system is arranged therein.

In the above implementations, the description of each implementation has its own emphasis. For the part not detailed in one implementation, referring to the relevant description of other implementations.

The above describes in detail a semiconductor device and its manufacturing method, a memory and a memory system provided by the implementations of the present disclosure. A specific example is applied herein to explain the principle and implementation of the present disclosure. The description of the above implementation is only used to help understand the technical solutions and their core ideas of the present disclosure. Those ordinary skill in the art should understand that they can still modify the technical solutions recited in the above implementations, or make equivalent replacement for some of the technical features. These modifications or replacements do not make the essence of the corresponding technical solutions depart from the scope of the technical solutions of the implementations of the present disclosure.

The invention claimed is:

1. A semiconductor device, comprising:
   a stack structure including a plurality of interlayer insulating layers and gate layers arranged alternately along a stack direction, wherein the stack structure includes an array region and a staircase region adjoining the array region, the stack structure has a plurality of staircases in the staircase region arranged corresponding to the gate layers, each of the gate layers includes a first gate part at the corresponding staircase and a second gate part connected to the first gate part, and a thickness of the first gate part along the stack direction is less than that of the second gate part along the stack direction; and
   a first conductive pillar arranged in the staircase region and penetrating through the stack structure along the stack direction, wherein the first conductive pillar is electrically connected with the first gate part.

2. The semiconductor device according to claim 1, wherein the first conductive pillar penetrates through a plurality of the gate layers along the stack direction, and the semiconductor device further comprises:
   a conducting part between the first conductive pillar and the first gate part of one of the gate layers and arranged around the first conductive pillar; and
   an insulating part between the first conductive pillar and the second gate parts of the other gate layers and arranged around the first conductive pillar,
   wherein the first gate part is arranged around the conducting part and in contact with the conducting part, the first conductive pillar is electrically connected with the corresponding one first gate part through the conducting part, and the second gate part is arranged around the insulating part.

3. The semiconductor device according to claim 2, wherein a width of the conducting part along a first direction is less than that of the insulating part along the first direction, and the first direction is perpendicular to the stack direction.

4. The semiconductor device according to claim 2, wherein the first gate part further comprises a conductive layer and a first dielectric layer at least between the conductive layer and the interlayer insulating layer, and the conductive layer is in contact with the conducting part, and a thickness of the conducting part along the stack direction is greater than that of the conductive layer along the stack direction.

5. The semiconductor device according to claim 2, wherein the conducting part further comprises a conductive sub-part and a first adhesive buffer sub-part, the first adhesive buffer sub-part is between the first gate part and the conductive sub-part, and the conductive sub-part is between the first conductive pillar and the first adhesive buffer sub-part.

6. The semiconductor device according to claim 5, wherein the first conductive pillar further comprises a conductive body and a second adhesive buffer sub-part covering the conductive body, and the second adhesive buffer sub-part is between the conductive sub-part and the conductive body.

7. The semiconductor device according to claim 1, wherein the semiconductor device further comprises a support pillar arranged in the staircase region, and the support pillar penetrates through the stack structure along the stack direction.

8. The semiconductor device according to claim 1, wherein the semiconductor device further comprises:
   a peripheral region on a side of the staircase region away from the array region, and a dielectric layer covering the stack structure and extending to the peripheral region; and
   a second conductive pillar arranged in the peripheral region and penetrating through the dielectric layer, and a material of the second conductive pillar is the same as that of the first conductive pillar.

9. The semiconductor device according to claim 1, wherein the semiconductor device further comprises a gate slit penetrating through the stack structure along the stack direction, and a semiconductor layer and an oxide layer filled in the gate slit, and the oxide layer covers a side wall of the semiconducting layer.

10. A manufacturing method of a semiconductor device comprising the steps of:
    forming a stack structure which includes a plurality of interlayer insulating layers and a plurality of gate layers formed alternately along a stack direction, wherein the stack structure includes an array region and a staircase region adjoining the array region, a plurality of staircases corresponding to the gate layers are formed in the staircase region of the stack structure, each of the gate layers includes a first gate part at the corresponding staircase and a second gate part connected to the first gate part, and a thickness of the first gate part along the stack direction is less than that of the second gate part along the stack direction; and
    forming, in the staircase region, a first conductive pillar penetrating through the stack structure along the stack direction, the first conductive pillar being electrically connected with the first gate part.

11. The manufacturing method of the semiconductor device according to claim 10, wherein the step of forming the stack structure further comprises:
provides a substrate;
forming the plurality of interlayer insulating layers and gate sacrificial layers laminated along the stack direction on the substrate, wherein the plurality of interlayer insulating layers and the plurality of gate sacrificial layers form a plurality of initial staircases in the staircase region, and each of the initial staircases includes one of the gate sacrificial layers and one of the interlayer insulating layers, wherein the one of the gate sacrificial layers and the one of the interlayer insulating layers are in the staircase region and laminated;
thinning the gate sacrificial layer at each of the initial staircases;
removing the gate sacrificial layer to form a plurality of slots; and
forming the plurality of gate layers in the plurality of slots to obtain the stack structure.

12. The manufacturing method of the semiconductor device according to claim 11, wherein, after the step of thinning the gate sacrificial layer at each of the initial staircases, the manufacturing method further comprises:
forming a first contact hole in the staircase region, the first contact hole penetrating through the stack structure along the stack direction; and
forming an intermediate column in the first contact hole.

13. The manufacturing method of the semiconductor device according to claim 12, wherein the step of forming the plurality of gate layers in the plurality of slots to obtain the stack structure further comprises:
removing the intermediate column in the first contact hole; and
making the first contact hole penetrate through the plurality of gate layers along the stack direction, etching the first gate part of one of the gate layers in the first contact hole to form a first groove, and etching the second gate part of the other gate layers in the first contact hole to form a second groove.

14. The manufacturing method of the semiconductor device according to claim 13, wherein the step of forming, in the staircase region, a first conductive pillar penetrating through the stack structure along the stack direction further comprises:
forming a conductive functional material layer in the first contact hole, wherein the conductive functional material layer is filled in the first groove and covers an inner wall of the second groove;
removing at least the conductive functional material layer outside the first groove to form a conducting part in the first groove, wherein the first gate part is around the conducting part and in contact with the conducting part;
forming an insulating part in the second groove, wherein the second gate part is around the insulating part; and
forming the first conductive pillar corresponding to the first contact hole, wherein the first conductive pillar is electrically connected with the first gate part through the conducting part in the first contact hole.

15. The manufacturing method of the semiconductor device according to claim 14, wherein the step of forming a conducting part in the first groove includes forming a conductive sub-part and a first adhesive buffer sub-part, and wherein the first adhesive buffer sub-part is formed between the first gate part and the conductive sub-part, and the conductive sub-part is formed between the first conductive pillar and the first adhesive buffer sub-part.

16. The manufacturing method of the semiconductor device according to claim 15, wherein the step of forming a plurality of the first conductive pillars corresponding to the respective first contact holes includes forming a conductive body and a second adhesive buffer sub-part covering the conductive body, and wherein the second adhesive buffer sub-part is formed between the conductive sub-part and the conductive body.

17. The manufacturing method of the semiconductor device according to claim 14, wherein:
the semiconductor device further comprises a peripheral region on a side of the staircase region away from the array region and a dielectric layer formed at least in the peripheral region, and
the step of forming a first contact hole in the staircase region further comprises:
using the same process to form the first contact hole, a second contact hole in the staircase region and form a third contact hole in the peripheral region, wherein the first contact hole and the second contact hole both penetrate through the stack structure along the stack direction, and the third contact hole penetrates through the dielectric layer along the stack direction.

18. The manufacturing method of the semiconductor device according to claim 17, wherein
the step of forming an intermediate column in the first contact hole further comprises:
forming a support pillar in the second contact hole, and
the step of forming the first conductive pillar corresponding to the first contact hole further comprises:
forming a second conductive pillar in the peripheral region, wherein the second conductive pillar is formed in the third contact hole.

19. A storage system, comprising:
a memory including a semiconductor device having a stack structure including a plurality of interlayer insulating layers and gate layers arranged alternately along a stack direction, wherein the stack structure includes an array region and a staircase region adjoining the array region, the stack structure has a plurality of staircases in the staircase region arranged corresponding to the gate layers, each of the gate layers includes a first gate part at the corresponding staircase and a second gate part connected to the first gate part, and a thickness of the first gate part along the stack direction is less than that of the second gate part along the stack direction;
a first conductive pillar arranged in the staircase region and penetrating through the stack structure along the stack direction, wherein the first conductive pillar is electrically connected with the first gate part; and
a controller which is coupled to the memory and used to control the memory to store data.

* * * * *